United States Patent
Sun et al.

(10) Patent No.: US 11,336,091 B2
(45) Date of Patent: May 17, 2022

(54) ENERGY STORAGE POWER SUPPLY, PARALLEL CONTROL DEVICE FOR ENERGY STORAGE POWER SUPPLIES, AND PARALLEL CONTROL METHOD FOR ENERGY STORAGE POWER SUPPLIES

(71) Applicant: SHENZHEN HELLO TECH ENERGY CO LTD, Shenzhen (CN)

(72) Inventors: Zhongwei Sun, Shenzhen (CN); Jie Zhang, Shenzhen (CN); Zhiyuan Zhong, Shenzhen (CN); Yanqiu Chu, Shenzhen (CN); Peixin Zhang, Shenzhen (CN); Hongwei Mi, Shenzhen (CN)

(73) Assignee: Shenzhen Hello Tech Energy Co Ltd., Shenzhen (CN)

( * ) Notice: Subject to any disclaimer, the term of this patent is extended or adjusted under 35 U.S.C. 154(b) by 0 days.

(21) Appl. No.: 17/094,977

(22) Filed: Nov. 11, 2020

(65) Prior Publication Data
US 2022/0037881 A1     Feb. 3, 2022

(30) Foreign Application Priority Data
Jul. 31, 2020    (CN) .......................... 202010760548.1

(51) Int. Cl.
*H02J 1/10*        (2006.01)
*G01R 21/00*     (2006.01)
(Continued)

(52) U.S. Cl.
CPC .............. *H02J 1/102* (2013.01); *G01R 21/00* (2013.01); *H02J 3/46* (2013.01); *H02M 7/44* (2013.01)

(58) Field of Classification Search
CPC . H02J 1/102; H02J 3/46; G01R 21/00; H02M 7/44
(Continued)

(56) References Cited

U.S. PATENT DOCUMENTS 5,446,645 A * 8/1995 Shirahama ............ H02M 7/493
363/71
8,422,256 B2 4/2013 Giuntini et al.
(Continued)

OTHER PUBLICATIONS

European Search Report, dated Mar. 29, 2021, 8 pgs.

*Primary Examiner* — Hal Kaplan
(74) *Attorney, Agent, or Firm* — Saxton & Stump, LLC

(57) ABSTRACT

Provided are an energy storage power supply, a parallel control device for energy storage power supplies and a parallel control method for energy storage power supplies. The energy storage power supply includes a battery module; an inverter module electrically connected to the battery module; an output module electrically connected to the inverter module; an detection module electrically connected to the output module; an communication module communicated with another energy storage power supply; an switching module electrically connected to the inverter module or the output module; and a processor module electrically connected to the detection module, the communication module and the switching module, and is configured to control, according to the power of a load detected by the detection module, the switching module to be electrically connected to the inverter module or the output module.

11 Claims, 4 Drawing Sheets

(51) Int. Cl.
*H02J 3/46* (2006.01)
*H02M 7/44* (2006.01)

(58) Field of Classification Search
USPC .......................................................... 307/18
See application file for complete search history.

(56) References Cited

U.S. PATENT DOCUMENTS

2011/0090726 A1  4/2011  Brotto et al.
2015/0194707 A1  7/2015  Park
2017/0237128 A1  8/2017  Kubo

* cited by examiner

ENERGY STORAGE POWER SUPPLY, PARALLEL CONTROL DEVICE FOR ENERGY STORAGE POWER SUPPLIES, AND PARALLEL CONTROL METHOD FOR ENERGY STORAGE POWER SUPPLIES

TECHNICAL FIELD

Embodiments of the present disclosure relate to energy storage power supply technologies, and in particular, to an energy storage power supply, a parallel control device for energy storage power supplies and a parallel control method for energy storage power supplies.

BACKGROUND

An energy storage power supply is becoming more and more popular in a consumer space, but various problems have been found as follows. For example, a capacity of the energy storage power supply is insufficient or power of the energy storage power supply is too small, so the energy storage power supply probably fails to drive a load apparatus with larger power. Therefore, a parallel device for energy storage power supplies is required to supply power to a load apparatus requiring high-power power supply, so as to ensure electric energy required for normal operation of the load apparatus.

Currently, in the existing energy storage power supply, in a parallel working process, power does not need to be doubled when load power is relatively small; while in order to achieve a function of parallel power simultaneously, a corresponding synchronous circuit of the energy storage power supply needs to consume additional electric energy when works, thereby affecting service time of the energy storage power supply.

SUMMARY

Embodiments of the present disclosure provides an energy storage power supply, a parallel control device for energy storage power supplies and a parallel control method for energy storage power supplies, so as to achieve the automatic switching, according to the detected power of the load when the energy storage power supplies work in parallel, between a parallel power state and a parallel capacity state, thereby effectively extending the service time of the energy storage power supplies.

In a first aspect, an embodiment of the present disclosure provides an energy storage power supply including a battery module, an inverter module, an output module, a detection module, a communication module, a switching module, and a processor module.

The inverter module is electrically connected to the battery module, and is configured to convert a direct current of the battery module into an alternating current.

The output module is electrically connected to the inverter module, and is configured to output the alternating current after the inverter module is turned on.

The detection module is electrically connected to the output module, and is configured to detect power of a load electrically connected to the energy storage power supply through the output module.

The communication module is configured to communicate with another energy storage power supply.

The switching module is electrically connected to the inverter module or the output module.

The processor module is electrically connected to the detection module, the communication module and the switching module, and is configured to control, according to the power of the load detected by the detection module, the switching module to be electrically connected to the inverter module or the output module.

Optionally, the switching module includes a first switch, a second switch, a third switch, a first branch and a second branch, the first switch is electrically connected to the inverter module through the first branch, and the second switch and the third switch are electrically connected to the output module through the second branch.

Optionally, the processor module is configured to control, according to the power of the load detected by the detection module, switching states of the first switch, the second switch and the third switch.

Optionally, in response to both the first switch and the second switch being closed, the direct current of the battery module and a direct current of the another energy storage power supply flow to the inverter module after the battery module and a battery module of the another energy storage power supply are connected in parallel through a connecting line.

Optionally, in response to both the first switch and the third switch being closed, the direct current of the battery module is converted into the alternating current through the inverter module, and through a connecting line, the alternating current of the energy storage power supply and an alternating current of the another energy storage power supply are output by the output module.

Optionally, a communication mode of the communication module is a wireless communication mode, and the wireless communication mode is WiFi, Bluetooth or Zigbee.

In a second aspect, an embodiment of the present disclosure further provides a parallel control device for energy storage power supplies including at least two energy storage power supplies of first aspect and a connecting line connected to the at least two energy storage power supplies, and the connecting line is configured to connect switching modules of the at least two energy storage power supplies.

Optionally, each of the switching modules includes a first switch, a second switch, a third switch, a first branch and a second branch, the first switch is electrically connected to the inverter module through the first branch, and the second switch and the third switch are electrically connected to an output module through the second branch.

Optionally, in response to power of a load being less than a preset power threshold, a processor module of each of the at least two energy storage power supplies is configured to control the first switch and the second switch to be closed so that a parallel connection state of the at least two energy storage power supplies enters into a parallel capacity state.

In response to the power of the load being greater than the preset power threshold, the processor module of the each of the at least two energy storage power supplies is configured to control the second switch and the third switch to be closed so that the parallel connection state of the at least two energy storage power supplies enters into a parallel power state, and the processor module of the each of the at least two energy storage power supplies is further configured to adjust a voltage and a phase of the alternating current output by the inverter module according to a signal from a communication module.

Optionally, the preset power threshold is 80% of maximum output power of the each of the at least two energy storage power supplies.

In a third aspect, an embodiment of the present disclosure further provides a parallel control method for energy storage power supplies. The parallel control method for energy storage power supplies is implemented by the processor module of each energy storage power supply of the first aspect, and the method includes steps described below.

Power of a load detected by a detection module of the each energy storage power supply is acquired.

In response to the power of the load being greater than a preset power threshold, a communication module of the each energy storage power supply is awakened, and a switching module of the each energy storage power supply is controlled so that the energy storage power supplies enter into a parallel power state.

In response to the power of the load being less than the preset power threshold, the communication module is controlled to be turned off, and a switching module of the each energy storage power supply is controlled so that the energy storage power supplies enter into a parallel capacity state.

In the energy storage power supply, the parallel control device for energy storage power supplies, and the parallel control method for energy storage power supplies provided by embodiments of the present disclosure, the energy storage power supply includes the battery module, the inverter module, the output module, the detection module, the communication module, the switching module, and the processor module. The inverter module is electrically connected to the battery module. The output module is electrically connected to the inverter module. The detection module is electrically connected to the output module, and detects the power of the load electrically connected to the energy storage power supply through the output module. The communication module is configured to communicate with another energy storage power supply. The switching module is electrically connected to the inverter module or the output module. The processor module is electrically connected to the detection module, the communication module and the switching module, and controls the switching module to be electrically connected to the inverter module or the output module according to the power of the load detected by the detection module. Compared with the existing energy storage power supply, the energy storage power supply, the parallel control device for energy storage power supplies, and the parallel control method for energy storage power supplies provided by embodiments of the present disclosure control the switching module to be electrically connected to inverter module or the output module through the processor module. For example, when the energy storage power supplies are connected in parallel, if power of the load is less than output power of the energy storage power supply, the parallel capacity state of the energy storage power supply can be achieved through the control of the processor module, such that electric energy demand of the load can be satisfied and meanwhile waste of the electric energy stored by the energy storage power supply can be avoided; and if the power of the load is greater than the output power of the energy storage power supply, the parallel power state of the energy storage power supply can be achieved through the control of the processor so as to supply power-multiplied electric energy to the load, such that the electric energy supplied to the load satisfies the demand of the load, that is, when the energy storage power supply works in parallel, automatic switching between the parallel power state and the parallel capacity state according to detected power of the load can be achieved, thereby effectively extending the service time of the energy storage power supply.

DETAILED DESCRIPTION

Figure 1:
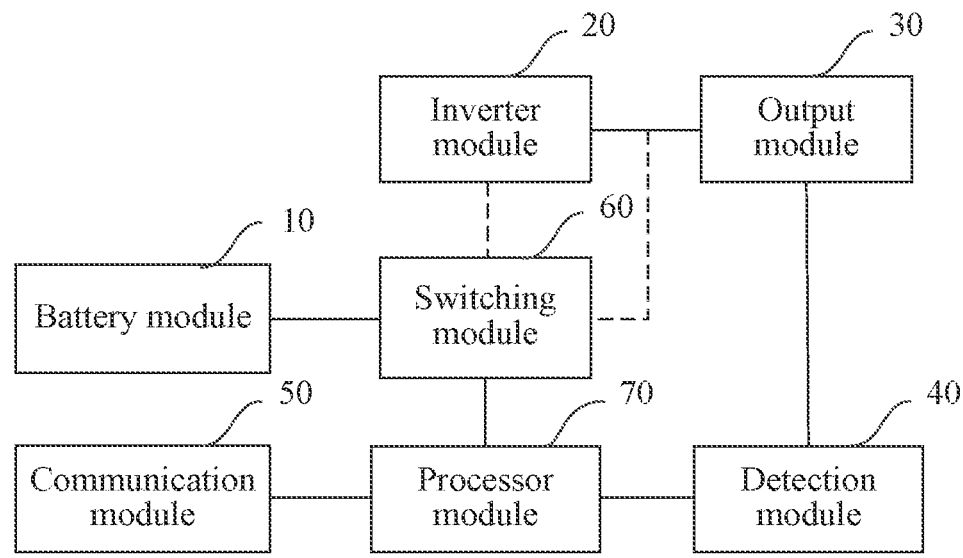
FIG. 1 is a block diagram illustrating an energy storage power supply according to embodiment one of the present disclosure.

Hereinafter the present disclosure is further described in detail in conjunction with the drawings and embodiments. It is to be understood that the specific embodiments set forth below are intended to illustrate and not to limit the present disclosure. Additionally, it is to be noted that for ease of description, only part, not all, of the structures related to the present disclosure are illustrated in the drawings.

Embodiment One

FIG. 1 is a block diagram illustrating an energy storage power supply according to embodiment one of the present disclosure. The embodiment may be applied to a case of supplying power to a power supply apparatus or the like. The energy storage power supply includes a battery module 10, an inverter module 20, an output module 30, a detection module 40, a communication module 50, a switching module 60, and a processor module 70.

The inverter module 20 is electrically connected to the battery module 10, and is used for converting a direct current of the battery module 10 into an alternating current. The output module 30 is electrically connected to the inverter module 20, and is used for outputting the alternating current after the inverter module 20 is turned on. The detection module 40 is electrically connected to the output module 30, and is used for detecting power of a load electrically connected to the energy storage power supply through the output module 30. The communication module 50 is used for communicating with another energy storage power supply. The switching module 60 is electrically connected to the inverter module 20 or the output module 30. The processor module 70 is electrically connected to the detection module 40, the communication module 50 and the switching module 60, and is used for controlling the switching module 60 to be electrically connected to the inverter module 20 or the output module 30 according to the power of the load detected by the detection module 40.

Specifically, when the energy storage power supplies supply power to the load, two energy storage power supplies being connected in parallel are described as an example. The load is electrically connected to an output module 30 of one energy storage power supply of the two energy storage power supplies, switching modules 60 of the two energy storage power supplies are electrically connected to each other through a connecting line, and a detection module 40 of the energy storage power supply electrically connected to the load detects power of the load. When the power of the load is less than a preset power threshold, a processor module 70 of the energy storage power supply electrically connected to the load controls a switching module 60 to be electrically connected to an inverter module 20, a processor module 70 of the other energy storage power supply controls a switching module 60 to be electrically connected to an output module 30 such that direct current of a battery module 10 is transmitted to the switching module 60 of the energy storage power supply electrically connected to the load through the switching module 60 of the other energy storage power supply. In this way, direct currents of the two energy storage power supplies are both inverted into alternating currents through the inverter modules 20 electrically connected to the switching modules 60, and transmitted to the load through the output module 30 electrically connected to the load, so as to supply power to the load. At this time, a parallel connection state of the two energy storage power supplies is a parallel capacity state, that is, when the power of the load is relatively small, the energy storage power supplies can supply power to the load with parallel capacity, thus satisfying the electric energy demand of the load, and meanwhile avoiding waste of electric energy stored by the energy storage power supply. The preset power threshold may be 80% of maximum output power of the energy storage power supply. When the power of the load is greater than the preset power threshold, the processor module 70 of the energy storage power supply electrically connected to the load controls the switching module 60 to be electrically connected to the inverter module 20, and controls a loop in which the switching module 60 is connected to the output module 30 through the connecting line, to be connected. The processor module 70 of the other energy storage power supply controls the switching module 60 to be electrically connected to the inverter module 20, and controls a loop, in which the switching module 60 is connected to the output module 30 through the connecting line, to be connected, such that a direct current of the battery module 10 is inverted into an alternating current through the inverter module 20, and the alternating current is transmitted to the switching module 60 of the energy storage power supply electrically connected to the load through the connecting line, thereby enabling the alternating current to be transmitted to the output module 30 through the switching module 60. Meanwhile, the direct current of the battery module 10 of the energy storage power supply electrically connected to the load is transmitted to the inverter module 20 through the switching module 60, and the inverter module 20 inverts the direct current to the alternating current. A communication module 50 of the energy storage power supply electrically connected to the load communicates with a communication module 50 of the other energy storage power supply and receives a communication signal transmitted by the communication module 50 of the other energy storage power supply. The communication signal includes a signal of voltage and phase of the alternating current of the other energy storage power supply. The processor module 70 of the energy storage power supply electrically connected to the load controls, according to the communication signal received by the communication module 50, a voltage and a phase of the alternating current output by the inverter module 20, such that voltages and phases of alternating currents of the two energy storage power supplies are consistent, and the alternating currents of the two energy storage power supplies are both transmitted to the load through the output module 30 electrically connected to the load, so as to supply power to the load. At this time, the parallel connection state of the two energy storage power supplies is the parallel power state. In this way, power-multiplied electric energy is supplied to the load so as to satisfying the demand of the load. Therefore, when the energy storage power supply works in parallel, automatic switching between the parallel power state and the parallel capacity state can be achieved according to detected power of the load, thereby effectively improving service time of the energy storage power supplies.

The energy storage power supply provided by the embodiment includes the battery module, the inverter module, the output module, the detection module, the communication module, the switching module, and the processor module. The inverter module is electrically connected to the battery module. The output module is electrically connected to the inverter module. The detection module is electrically connected to the output module, and detects the power of the load electrically connected to the energy storage power supply through the output module. The communication module communicates with the other energy storage power supply.

The switching module is electrically connected to the inverter module or the output module. The processor module is electrically connected to the detection module, the communication module and the switching module, and controls the switching module to be electrically connected to the inverter module or the output module according to the power of the load detected by the detection module. Compared with the existing energy storage power supply, the energy storage power supply provided by the embodiment controls the switching module to be electrically connected to inverter module or the output module through the processor module. For example, when the energy storage power supplies are connected in parallel to supply power, if the power of the load is less than the output power of the energy storage power supply, the parallel capacity state of the energy storage power supply can be achieved through the control of the processor module, such that electric energy demand of the load can be satisfied and meanwhile waste of the electric energy stored by the energy storage power supply can be avoided; and if the power of the load is greater than the output power of the energy storage power supply, the parallel power state of the energy storage power supply can be achieved through the control of the processor module so as to supply power-multiplied electric energy to the load, such that the electric energy supplied to the load satisfies the demand of the load. That is, when the energy storage power supplies work in parallel, automatic switching between the parallel power state and the parallel capacity state can be achieved according to detected power of the load, thereby effectively improving service time of the energy storage power supply.

Figure 2:
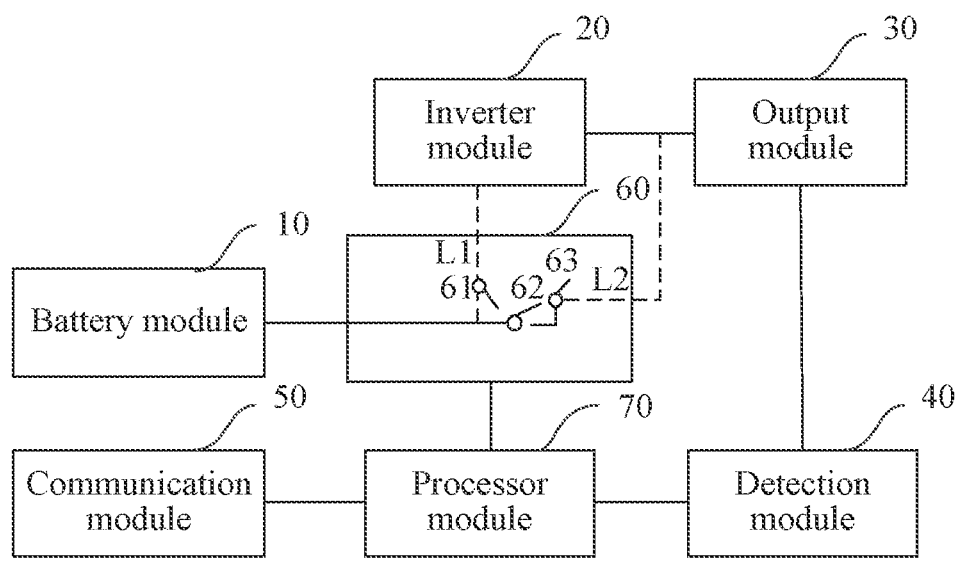
FIG. 2 is a block diagram illustrating another energy storage power supply according to embodiment one of the present disclosure.

FIG. 2 is a block diagram illustrating another energy storage power supply according to embodiment one of the present disclosure. Referring to FIG. 2, optionally, the switching module 60 includes a first switch 61, a second switch 62, a third switch 63, a first branch L1 and a second branch L2. The first switch 61 is electrically connected to the inverter module 20 through the first branch L1. The second switch 62 and the third switch 63 are electrically connected to the output module 30 through the second branch L2.

In a case of the first switch 61 being closed, the battery module 10 is electrically connected to the inverter module 20 through the switching module 60. When the first switch 61 is closed, a direct current of the battery module 10 can be transmitted to the inverter module 20 through the switching module 60. In a case of the second switch 62 and the third switch 63 being closed, the direct current of the battery module 10 can be transmitted to the output module 30 through the switching module 60.

Optionally, the processor module 70 is configured to control switching states of the first switch 61, the second switch 62 and the third switch 63 according to the power of the load detected by the detection module 40.

The processor module 70 controls the first switch 61, the second switch 62, and the third switch 63 to be turned on or off according to the power of the load detected by the detection module 40. For example, when the power of the load detected by the detection module 40 is less than a preset power threshold, the processor module 70 controls both the first switch 61 and the second switch 62 to be closed such that a parallel connection state of the energy storage power supplies working in parallel is a parallel capacity state.

Optionally, when the first switch 61 and the second switch 62 are both closed, direct currents of two energy storage power supplies flow to the inverter module 20 after the two energy storage power supplies are connected in parallel through a connecting line.

Specifically, when the output module 30 of the energy storage power supply is electrically connected to the load, and the energy storage power supply works in parallel with another energy storage power supply, the switching module 60 of the energy storage power supply is electrically connected to the switching module 60 of the another energy storage power supply through a connecting line. If the power of the load detected by the detection module 40 is less than the preset power threshold, the processor module 70 controls both the first switch 61 and the second switch 62 to be closed such that a direct current of each energy storage power supply is inverted into an alternating current through the inverter module 20 of the energy storage power supply electrically connected to the load, and the alternating current is output to the load through the output module 30. At this time, a parallel connection state of the energy storage power supply is a parallel capacity state. That is, when the power of the load is relatively small, the energy storage power supply can supply power to the load with parallel capacity, thus satisfying the demand of the load, and meanwhile avoiding waste of electric energy stored by the energy storage power supplies.

Optionally, when the first switch 61 and the third switch 63 are both closed, the direct current of the energy storage power supply is converted into the alternating current through the inverter module 20, and then the alternating current of the energy storage power supply and the alternating current of the another energy storage power supply are output through the output module 30 through a connecting line.

Specifically, when the output module 30 of the energy storage power supply is electrically connected to the load, and the energy storage power supply works in parallel with the other energy storage power supply, the switching module 60 of the energy storage power supply is electrically connected to the switching module 60 of the other energy storage power supply through the connecting line. If the power of the load detected by the detection module 40 is less than the preset power threshold, the processor module 70 controls both the first switch 61 and the third switch 63 to close such that all alternating currents inverted by the inverter module 20 of each energy storage power supply is output to the load through the output module 30 of the energy storage power supply electrically connected to the load. At this time, the parallel connection state of the energy storage power supply is the parallel power state. That is, when the power of the load is relatively large, the energy storage power supply can supply power to the load with parallel power and can supply power-multiplied electric energy to the load, such that the electric energy supplied to the load satisfies the demand of the load.

For example, when two energy storage power supplies are connected in parallel to supply power to the load, the load is electrically connected to the output module 30 of one energy storage power supply of the two energy storage power supplies, switching modules 60 of the two energy storage power supplies are electrically connected to each other through the connecting line, and the detection module 40 of the energy storage power supply electrically connected to the load detects the power of the load. When the power of the load is less than the preset power threshold, the processor module 70 of the energy storage power supply electrically connected to the load controls both the first switch 61 and the second switch 62 to be closed, such that a direct current of the battery module 10 is transmitted to the inverter module through the first switch 61. The processor module 70 of the other energy storage power supply of the two energy storage power supplies controls the second switch 62 to be closed such that a direct current of the battery module 10 is transmitted to the second switch 62 of the energy storage power supply electrically connected to the load through the second switch 62 of the other energy storage power supply and the connecting line and then to the inverter module 20 through the first switch 61. In this way, direct currents of the two energy storage power supplies are both inverted into alternating currents through the inverter module 20 of the energy storage power supply electrically connected to the load, and the alternating currents are transmitted to the load through the output module 30 electrically connected to the load, so as to supply power to the load. At this time, the parallel connection state of the two energy storage power supplies is the parallel capacity state, that is, when the power of the load is relatively small, the energy storage power supply can supply power to the load with parallel capacity, thus satisfying the electric energy demand of the load, and meanwhile avoiding waste of electric energy stored by the energy storage power supply. The preset power threshold may be 80% of maximum output power of the each of the at least two energy storage power supplies. When the power of the load is greater than the preset power threshold, the processor module 70 of the energy storage power supply electrically connected to the load controls both the first switch 61 and the third switch 63 to be closed, such that the direct current of the battery module 10 is transmitted to the inverter module through the first switch 61. The processor module 70 of the other energy storage power supply controls both the first switch 61 and the third switch 63 to be closed, such that the direct current of the battery module 10 is inverted to the alternating current through the inverter module and the alternating current is transmitted to the third switch 63 of the energy storage power supply electrically connected to load through the third switch 63 of the other energy storage power supply and the connecting line, and thereby the alternating current is transmitted to output module 30 through the third switch 63. In this way, the alternating currents of the two energy storage power supplies are output through the output module 30 of the energy storage power supply electrically connected to load. The communication module 50 of the energy storage power supply electrically connected to the load communicates with the communication module 50 of the other energy storage power supply and receives the communication signal transmitted by the communication module 50 of the other energy storage power supply. The communication signal includes a signal of a voltage and a phase of the alternating current of the other energy storage power supply. The processor module 70 of the energy storage power supply electrically connected to the load controls, according to the communication signal received by the communication module 50, a voltage and a phase of the alternating current output by the inverter module 20, such that voltages and phases of alternating currents of the two energy storage power supplies are consistent, and the alternating currents of the two energy storage power supplies are both transmitted to the load through the output module 30 electrically connected to the load, so as to supply power to the load. At this time, the parallel connection state of the two energy storage power supplies is the parallel power state. In this way, power-multiplied electric energy is supplied to the load such that the electric energy supplied to the load satisfies the demand of the load. That is, when the energy storage power supplies work in parallel, automatic switching between the parallel power state and the parallel capacity state can be achieved according to detected power of the load, thereby effectively improving service time of the energy storage power supplies.

Optionally, a communication mode of the communication module 50 is a wireless communication mode, and the wireless communication mode is WiFi, Bluetooth or Zigbee.

Specifically, the Bluetooth may be used for communication when the two energy storage power supplies are connected in parallel, the WiFi may be used for communication when more than two energy storage power supplies are connected in parallel, and the Zigbee may be used for communication when a distance between each of energy storage power supplies connected in parallel is relatively small.

It is to be noted that the above-mentioned wireless communication mode of the communication module 50 is only exemplarily description, the wireless communication mode of the communication module 50 may be specifically set according to the actual situation, and is not limited herein.

Embodiment Two

Figure 3:
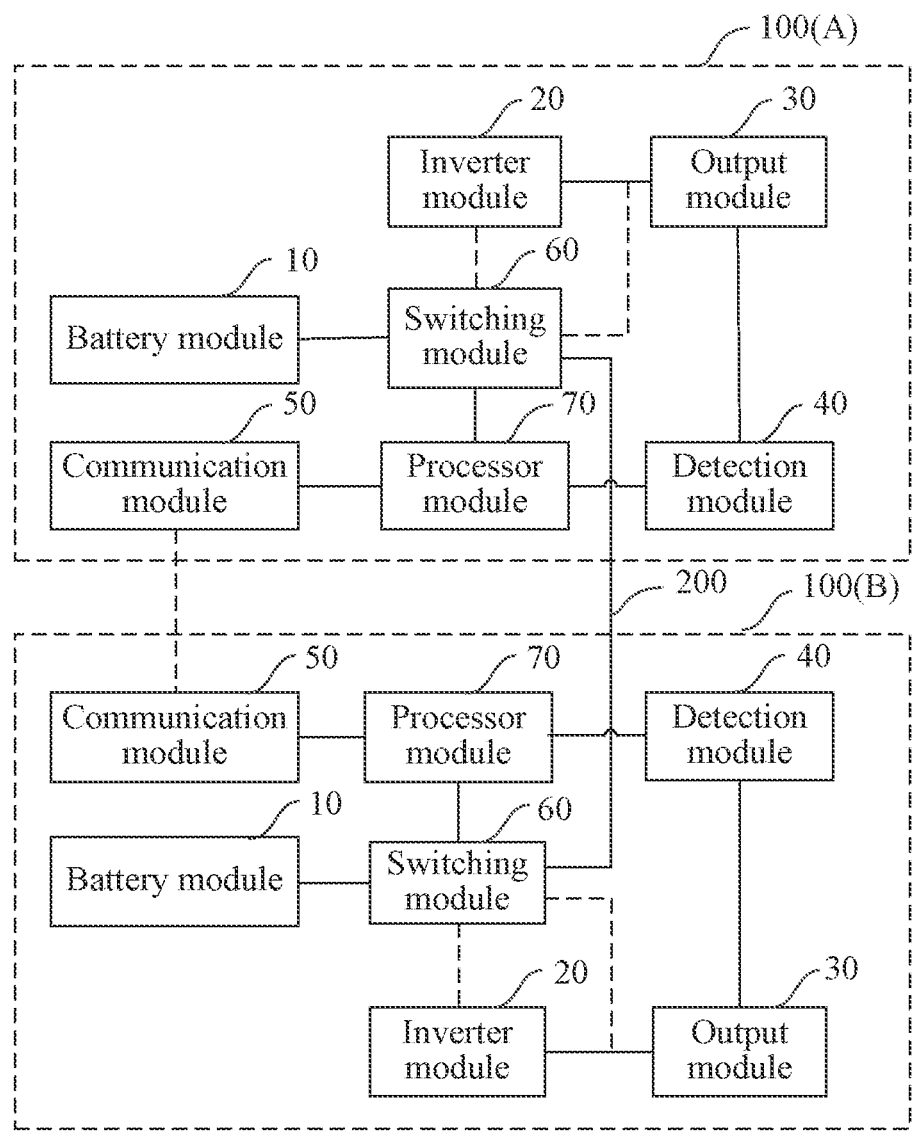
FIG. 3 is a block diagram illustrating a parallel control device for energy storage power supplies according to embodiment two of the present disclosure.

FIG. 3 is a block diagram illustrating a parallel control device for energy storage power supplies according to embodiment two of the present disclosure. The embodiment may be applied to a case of supplying power to a power supply apparatus or the like. The parallel control device for energy storage power supplies includes at least two energy storage power supplies 100 of embodiment one and a connecting line 200 connected to the at least two energy storage power supplies 100, and the connecting line 200 is configured to connect switching modules 60 of the at least two energy storage power supplies 100.

Specifically, switching modules 60 of each energy storage power supply 100 in the parallel control device for energy storage power supplies are in communication with each other through connecting lines 200. When the parallel control device for energy storage power supplies works, an output module 30 of one energy storage power supply, such as an energy storage power supply A, is electrically connected to a load, and a detection module 40 of the energy storage power supply A detects power of the load. When the power of the load is less than a preset power threshold, a processor module 70 of the energy storage power supply A controls a switching module 60 to be electrically connected to an inverter module 20, a processor module 70 of an energy storage power supply B controls a switching module 60 to be electrically connected to an output module 30 such that a direct current of the energy storage power supply B is transmitted to the switching module 60 of the energy storage power supply A through the switching module 60. In this way, direct currents of the two energy storage power supplies are both inverted into alternating currents through the inverter module 20 of the energy storage power supply A, and the alternating currents are transmitted to the load through the output module 30 of the energy storage power supply A, so as to supply power to the load. At this time, a parallel connection state of the two energy storage power supplies is a parallel capacity state, that is, when the power of the load is relatively small, the energy storage power supply can supply power to the load with parallel capacity, thus satisfying the electric energy demand of the load, and meanwhile avoiding waste of electric energy stored by the energy storage power supply. The preset power threshold may be 80% of the maximum output power of the energy storage power supply. When the power of the load is greater than the preset power threshold, the processor module 70 of the energy storage power supply A controls the switching module 60 to be electrically connected to the inverter module 20, and controls a loop, in which the switching module 60 is connected to the output module 30 through the connecting line 200, to be connected. The processor module 70 of the energy storage power supply B controls the switching module 60 to be electrically connected to the inverter module 20, and controls a loop, in which the switching module 60 is connected to the output module 30 through the connecting line 200, to be connected, such that the direct current of the energy storage power supply B is inverted into the alternating current through the inverter module 20, and the alternating current is transmitted to the switching module 60 of the energy storage power supply A through the connecting line 200, thereby enabling the alternating current to be transmitted to the output module 30 through the switching module 60. Meanwhile, the direct current of the energy storage power supply A is transmitted to the inverter module 20 through the switching module 60, and the inverter module 20 inverts the direct current. A communication module 50 of the energy storage power supply A communicates with a communication module 50 of the energy storage power supply B and receives a communication signal transmitted by the communication module 50 of the energy storage power supply B. The communication signal includes a voltage and phase signal of an alternating current of the energy storage power supply B. The processor module 70 of the energy storage power supply A controls, according to the communication signal received by the communication module 50, a voltage and a signal of the alternating current output by the inverter module 20, such that voltages and phases of alternating currents of the two energy storage power supplies are consistent, and the alternating currents of the two energy storage power supplies are both transmitted to the load through the output module 30 electrically connected to the load, so as to supply power to the load. At this time, the parallel connection state of the two energy storage power supplies is the parallel power state. In this way, power-multiplied electric energy is supplied to the load such that the electric energy supplied to the load satisfies the demand of the load. That is, when the energy storage power supplies work in parallel, automatic switching between the parallel power state and the parallel capacity state can be achieved according to detected power of the load, thereby effectively improving service time of the energy storage power supplies.

The parallel control device for energy storage power supplies provided by the embodiment includes at least two energy storage power supplies of embodiment one and the connecting line connected to the at least two energy storage power supplies, and the connecting line is configured to connect switching modules of the at least two energy storage power supplies. Compared with the existing parallel control device for energy storage power supplies, the parallel control device for energy storage power supplies provided by the embodiment controls, by the processor module, the switching module to be electrically connected to inverter module or the output module. If the power of the load is less than the output power of the energy storage power supply, the parallel capacity state of the energy storage power supply can be achieved through the control of the processor module, such that electric energy demand of the load can be satisfied and meanwhile waste of the electric energy stored by the energy storage power supply can be avoided; and if the power of the load is greater than the output power of the energy storage power supply, the parallel power state of the energy storage power supply can be achieved through the control of the processor module so as to supply power-multiplied electric energy to the load, such that the electric energy supplied to the load satisfies the demand of the load, that is, the parallel control device for energy storage power supplies can achieve automatic switching between the parallel power state and the parallel capacity state according to the power of the load, thereby effectively improving service time of the parallel control device for energy storage power supplies.

Figure 4:
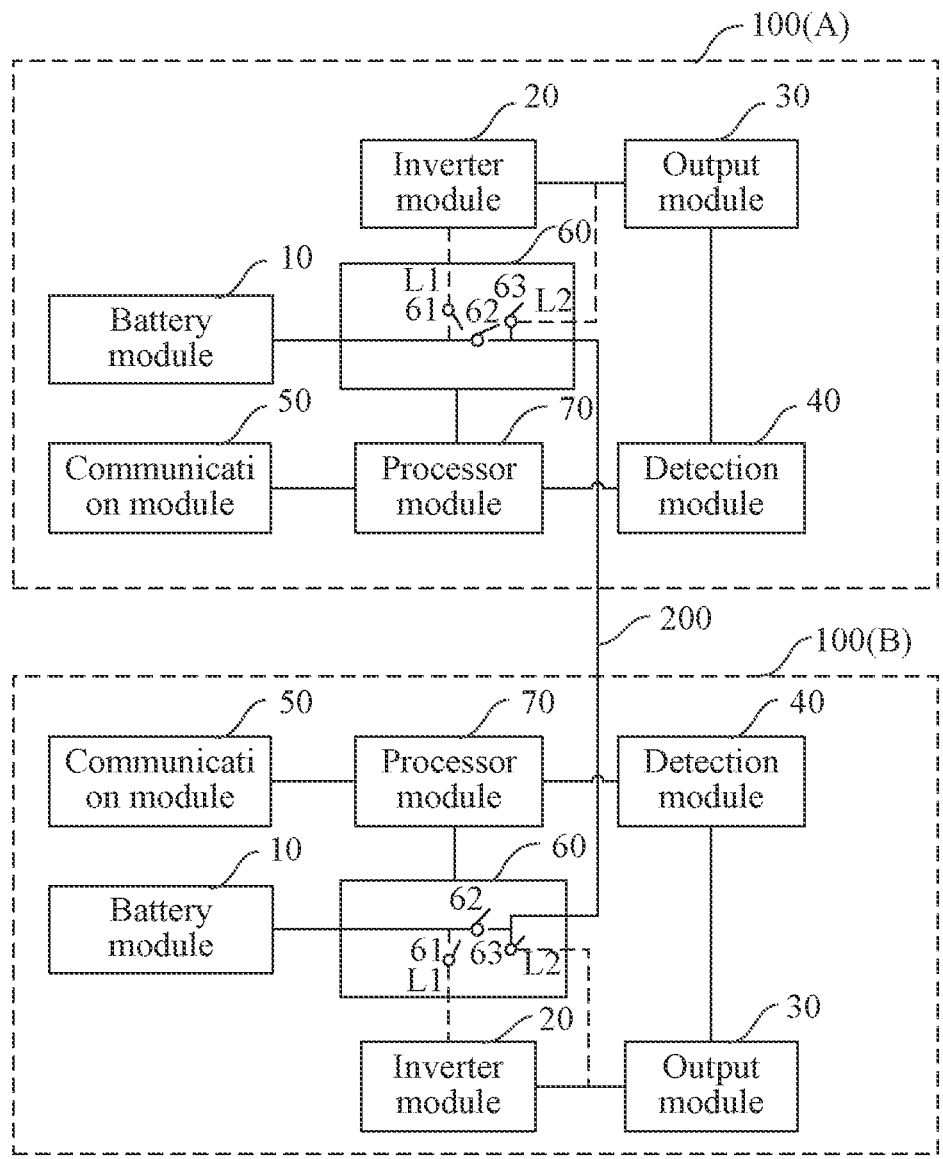
FIG. 4 is a block diagram illustrating another parallel control device for energy storage power supplies according to embodiment two of the present disclosure.

FIG. 4 is a block diagram illustrating another parallel control device for energy storage power supplies according to embodiment two of the present disclosure. Referring to FIG. 4, optionally, the switching module 60 of each of the energy storage power supplies includes a first switch 61, a second switch 62, a third switch 63, a first branch L1 and a second branch L2, the first switch 61 is electrically connected to the inverter module 20 through the first branch L1, and the second switch 62 and the third switch 63 are electrically connected to the output module 30 through the second branch L2.

When the first switch 61 is closed, the battery module 10 can be connected to the inverter module 20; when the first switch 61 and the second switch 62 are closed, the inverter module 20 can be connected to the battery module 10 of another energy storage power supply; and when the first switch 61 and the third switch 63 are closed, the output module 30 can be connected to the inverter module 20 of the another energy storage power supply. Therefore, connection of different circuits can be achieved through on-off of each switch.

Optionally, when the power of the load is less than the preset power threshold, the processor module 70 is used for controlling the first switch 61 and the second switch 62 to be closed, and the parallel connection state of the energy storage power supply 100 is the parallel capacity state; when the power of the load is greater than the preset power threshold, the processor module 70 is used for controlling the second switch 62 and the third switch 63 to be closed, and the parallel connection state of the energy storage power supply 100 is the parallel power state; and the processor module 70 is further used for adjusting the voltage and the phase of the alternating current output by the inverter module 20 according to the signal of the communication module 50.

Specifically, when the parallel control device for energy storage power supplies works, in a case where the output module 30 of the energy storage power supply A is electrically connected to the load, then the detection module 40 of the energy storage power supply A detects the power of the load. When the power of the load is less than the preset power threshold, the processor module 70 of the energy storage power supply A controls both the first switch 61 and the second switch 62 of the energy storage power supply A to be closed, and the processor module 70 of the energy storage power supply B controls the second switch 62 of the energy storage power supply B to be closed. At this time, a direct current of the energy storage power supply B is transmitted to the inverter module 20 of the energy storage power supply A through the connecting line 200, that is, direct currents of the two energy storage power supplies can be output after being inverted through the inverter module 20 of the energy storage power supply A. At this time, the two energy storage power supplies enters into the parallel capacity state, that is, when the power of the load is relatively small, the energy storage power supply A and the energy storage power supply B can supply power to the load with parallel capacity, thus satisfying the electric energy demand of the load, and meanwhile avoiding waste of electric energy stored by the energy storage power supply. When the power of the load is greater than the preset power threshold, the processor module 70 of the energy storage power supply A controls both the first switch 61 and the third switch 63 of the energy storage power supply A to be closed, and the processor module 70 of the energy storage power supply B controls both the first switch 61 and the third switch 63 of the energy storage power supply B to be closed. At this time, the alternating current of the energy storage power supply B is transmitted to the output module 30 of the energy storage power supply A through the connecting line 200. The processor module 70 of the energy storage power supply A adjusts, according to a signal of the communication module 50, a voltage and a phase of the alternating current output by the inverter module 20, such that voltages and phases of the alternating currents of the two energy storage power supplies are consistent, and both the alternating current of the energy storage power supply A and the alternating current of the energy storage power supply B can be output through the output module 30 of the energy storage power supply A so as to supply power to the load. At this time, the parallel connection state of the energy storage power supply A and the energy storage power supply B enters into the parallel power state. In this way, power-multiplied electric energy is supplied to the load such that the electric energy supplied to the load satisfies the demand of the load. That is, the parallel control device for energy storage power supplies can achieve automatic switching between the parallel power state and the parallel capacity state according to the power of the load, thereby effectively improving service time of the energy storage power supply.

Optionally, the preset power threshold is 80% of maximum output power of the energy storage power supply.

Specifically, the preset power threshold is configured to 80% of the maximum output power of the energy storage power supply, such that a single energy storage power supply will not work in the extreme working state, thereby reducing the heating or loss of the single energy storage power supply.

It is to be noted that the preset power threshold may be specifically set according to the actual situation, which is not limited herein.

Embodiment Three

Figure 5:
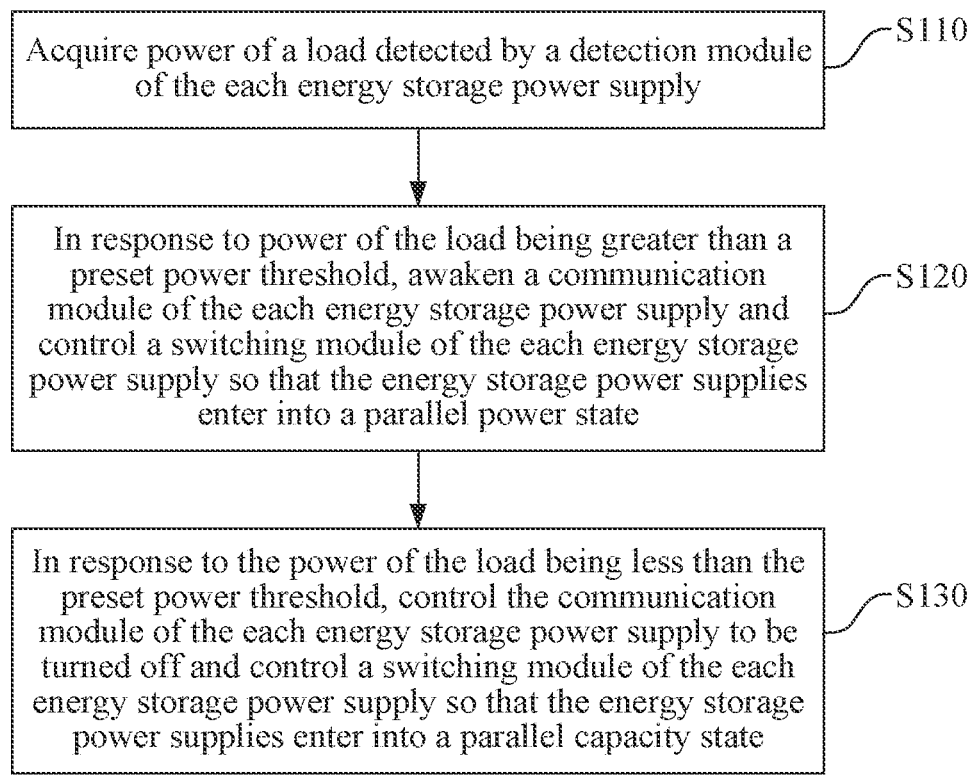
FIG. 5 is a flowchart illustrating a parallel control method for energy storage power supplies according to embodiment three of the present disclosure.

FIG. 5 is a flowchart illustrating a parallel control method for energy storage power supplies according to embodiment three of the present disclosure. The embodiment may be applied to a case of supplying power to a power supply apparatus or the like. The control method can be implemented by the processor module of the energy storage power supply of any one of the above-mentioned embodiments, and includes steps described below.

In step 110, power of a load detected by a detection module is acquired.

A processor module of the energy storage power supply can acquire the power of the load detected by the detection module through an input port which is electrically connected to the detection module and configured by the processor module itself, so as to control parallel connection states of the energy storage power supplies according to the power of the load.

In step 120, in response to the power of the load being greater than the preset power threshold, a communication module is awakened, and a switching module is controlled so as to bring the energy storage power supplies into a parallel power state.

The preset power threshold may be 80% of maximum output power of the energy storage power supply. When the power of the load is greater than the preset power threshold, the processor module awakens the communication module, and brings the energy storage power supplies into the parallel power state by controlling the switching module. In a parallel working process of the energy storage power supplies, the processor module can control the inverter module to adjust a voltage and a signal of an alternating current according to a signal of the communication module and output the adjusted alternating current, such that when the energy storage power supplies work in the parallel power state, the voltage and the phase of the alternating current output by the energy storage power supply and the voltages and the phases of the alternating currents of other energy storage power supplies are consistent, so as to supply power-multiplied electric energy to the load, and the electric energy demand of the load with larger power is satisfied.

In step 130, in response to power of a load being less than a preset power threshold, the communication module is controlled to be turned off, and the switching module is controlled so as to bring the energy storage power supplies into a parallel capacity state.

Specifically, when the power of the load is less than the preset power threshold, the processor module controls the communication module to be turned off, and brings the energy storage power supplies into the parallel capacity state by controlling the switching module, that is, when the power of the load is relatively small, the energy storage power supplies can supply power to the load with parallel capacity, thus satisfying the electric energy demand of the load, and meanwhile avoiding waste of electric energy stored by the energy storage power supplies.

Exemplarily, two energy storage power supplies A and B being connected to each other in parallel shown in FIG. 3 are described as an example. The two energy storage power supplies A and B are connected in parallel to supply power to the load. If an output module 30 of the energy storage power supply A is electrically connected to the load, a processor module 70 of the energy storage power supply A acquires the power of the load detected by the detection module 40. When the power of the load is greater than the preset power threshold, the processor module 70 of the energy storage power supply A awakens the communication module 50, controls the switching module 60 to be electrically connected to the inverter module 20 and controls a loop, in which the switching module 60 is connected to the output module 30 through the connecting line, to be connected. The processor module 70 of the energy storage power supply B controls the switching module 60 to be electrically connected to the inverter module 20 and a loop, in which the switching module 60 is connected to the output module 30 through the connecting line 200, to be connected, such that a direct current of the energy storage power supply B is inverted into an alternating current through the inverter module 20, and the alternating current is transmitted to the switching module 60 of the energy storage power supply A through the connecting line 200, and thereby the alternating current is transmitted to the output module 30 through the switching module 60. Meanwhile, the direct current of the energy storage power supply A is transmitted to the inverter module 20 through the switching module 60, and the direct current is inverted by the inverter module 20. A communication module 50 of the energy storage power supply A communicates with a communication module 50 of the energy storage power supply B, and receives a communication signal transmitted by the communication module 50 of the energy storage power supply B. The communication signal includes a signal of a voltage and a phase of the alternating current of the energy storage power supply B. The processor module 70 of the energy storage power supply A controls, according to the communication signal received by the communication module 50, a voltage and a phase of the alternating current output by the inverter module 20, such that voltages and phases of alternating currents of the two energy storage power supplies are consistent, and the alternating currents of the two energy storage power supplies are both transmitted to the load through the output module 30 electrically connected to the load, so as to supply power to the load. At this time, the parallel connection state of the two energy storage power supplies is the parallel power state. In this way, power-multiplied electric energy is supplied to the load such that the electric energy supplied to the load satisfies the demand of the load. The preset power threshold may be 80% of the maximum output power of the energy storage power supply. When the power of the load is less than the preset power threshold, the processor module 70 of the energy storage power supply A controls the communication module 50 to be turned off and the switching module 60 to be electrically connected to the inverter module 20. The processor module 70 of the energy storage power supply B controls the switching module 60 to be electrically connected to the output module 30, such that the direct current of the energy storage power supply B is transmitted to the switching module 60 of the energy storage power supply A through the switching module 60 of the energy storage power supply B, direct currents of the two energy storage power supplies are inverted into the alternating current through the inverter module 20 of the energy storage power supply A, and the alternating current is transmitted to the load through the output module 30 of the energy storage power supply A to supply power to the load. At this time, the parallel connection state of the two energy storage power supplies is the parallel capacity state, that is, when the power of the load is relatively small, the energy storage power supply A and the energy storage power supply B can supply power to the load with parallel capacity, thus satisfying the electric energy demand of the load, and meanwhile avoiding waste of electric energy stored by the energy storage power supply. That is, when the energy storage power supply A and the energy storage power supply B work in parallel, automatic switching between the parallel power state and the parallel capacity state can be achieved according to detected power of the load, thereby effectively improving service time of the energy storage power supplies.

The parallel control method for energy storage power supplies provided by the embodiment, the energy storage power supply and the parallel control device for energy storage power supplies provided by any one of embodiments of the present disclosure belong to the same inventive concept and have the same beneficial effects. For technical details not described in detail in the embodiment, reference may be made to the energy storage power supply and the parallel control device for energy storage power supplies provided by any one of embodiments of the present disclosure.

It is to be noted that the above are merely preferred embodiments of the present disclosure and the technical principles used therein. It will be understood by those skilled in the art that the present disclosure is not limited to the specific embodiments described herein. Those skilled in the art can make various apparent modifications, adaptations, combinations and substitutions without departing from the scope of the present disclosure. Therefore, while the present disclosure has been described in detail through the preceding embodiments, the present disclosure is not limited to the preceding embodiments and may include more other equivalent embodiments without departing from the concept of the present disclosure. The scope of the present disclosure is determined by the scope of the appended claims.

We claim:

1. An energy storage power supply, comprising:
a battery module;
an inverter module electrically connected to the battery module, wherein the inverter module is configured to convert a direct current of the battery module into an alternating current;
an output module electrically connected to the inverter module, wherein the output module is configured to output the alternating current after the inverter module is turned on;
a detection module electrically connected to the output module, wherein the detection module is configured to detect power of a load electrically connected to the energy storage power supply through the output module;
a communication module in communication with another energy storage power supply;
a switching module electrically connected to the inverter module or the output module; and
a processor module electrically connected to the detection module, the communication module and the switching module, wherein the processor module is configured to control, according to the power of the load detected by the detection module, the switching module to be electrically connected to the inverter module or the output module.

2. The energy storage power supply of claim 1, wherein the switching module comprises a first switch, a second switch, a third switch, a first branch and a second branch, the first switch is electrically connected to the inverter module through the first branch, and the second switch and the third switch are electrically connected to the output module through the second branch.

3. The energy storage power supply of claim 2, wherein the processor module is configured to control, according to the power of the load detected by the detection module, switching states of the first switch, the second switch and the third switch.

4. The energy storage power supply of claim 2, wherein in response to both the first switch and the second switch being closed, the direct current of the battery module and a direct current of the another energy storage power supply flow to the inverter module after the battery module and a battery module of the another energy storage power supply are connected in parallel through a connecting line.

5. The energy storage power supply of claim 2, wherein in response to both the first switch and the third switch being closed, the direct current of the battery module is converted into the alternating current through the inverter module, and through a connecting line, the alternating current of the energy storage power supply and an alternating current of the another energy storage power supply are output by the output module.

6. The energy storage power supply of claim 1, wherein a communication mode of the communication module is a wireless communication mode, and the wireless communication mode is WiFi, Bluetooth or Zigbee.

7. A parallel control device for energy storage power supplies, comprising: at least two energy storage power supplies of claim 1 and a connecting line connected to the at least two energy storage power supplies, wherein the connecting line is configured to connect the switching modules of the at least two energy storage power supplies.

8. The parallel control device for energy storage power supplies of claim 7, wherein each of the switching modules comprises a first switch, a second switch, a third switch, a first branch and a second branch, the first switch is electrically connected to the inverter module through the first branch, and the second switch and the third switch are electrically connected to an output module through the second branch.

9. The parallel control device for energy storage power supplies of claim 8, wherein in response to power of a load being less than a preset power threshold, a processor module of each of the at least two energy storage power supplies is configured to control the first switch and the second switch to be closed so that a parallel connection state of the at least two energy storage power supplies enters into a parallel capacity state; and
in response to the power of the load being greater than the preset power threshold, the processor module of the each of the at least two energy storage power supplies is configured to control the second switch and the third switch to be closed so that the parallel connection state of the at least two energy storage power supplies enters into a parallel power state, and the processor module of the each of the at least two energy storage power supplies is further configured to adjust a voltage and a phase of the alternating current output by the inverter module according to a signal from a communication module.

10. The parallel control device for energy storage power supplies of claim 9, wherein the preset power threshold is 80% of maximum output power of the each of the at least two energy storage power supplies.

11. A parallel control method for energy storage power supplies, wherein the parallel control method for energy storage power supplies is implemented by the processor module of each energy storage power supply of claim 1, and comprises:
acquiring power of a load detected by a detection module of the each energy storage power supply;

in response to the power of the load being greater than a preset power threshold, awakening a communication module of the each energy storage power supply, and controlling a switching module of the each energy storage power supply so that the energy storage power supplies enter into a parallel power state; and in response to the power of the load being less than the preset power threshold, controlling the communication module to be turned off, and controlling a switching module of the each energy storage power supply so that the energy storage power supplies enter into a parallel capacity state.

\* \* \* \* \*